(12) United States Patent
Chang et al.

(10) Patent No.: US 11,437,161 B1
(45) Date of Patent: Sep. 6, 2022

(54) LITHOGRAPHY APPARATUS AND METHOD FOR USING THE SAME

(71) Applicant: TAIWAN SEMICONDUCTOR MANUFACTURING COMPANY, LTD., Hsinchu (TW)

(72) Inventors: Chun-Lin Chang, Hsinchu County (TW); Chieh Hsieh, Taoyuan (TW); Shang-Chieh Chien, New Taipei (TW); Han-Lung Chang, Kaohsiung (TW); Heng-Hsin Liu, New Taipei (TW); Li-Jui Chen, Hsinchu (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/243,300

(22) Filed: Apr. 28, 2021

(51) Int. Cl.
  *G21K 1/06* (2006.01)
  *G03F 7/20* (2006.01)
  *H05G 2/00* (2006.01)

(52) U.S. Cl.
  CPC ........... *G21K 1/06* (2013.01); *G03F 7/70033* (2013.01); *G03F 7/70916* (2013.01); *H05G 2/005* (2013.01); *H05G 2/008* (2013.01)

(58) Field of Classification Search
  CPC ... G21K 1/06; G03F 7/70033; G03F 7/70916; H05G 2/005; H05G 2/008
  USPC ...................................................... 250/504 R
  See application file for complete search history.

(56) References Cited

U.S. PATENT DOCUMENTS

| | | | |
|---|---|---|---|
| 2010/0025223 A1* | 2/2010 | Yanagida | H05G 2/006 156/345.5 |
| 2010/0032590 A1* | 2/2010 | Bykanov | H05G 2/008 250/504 R |
| 2020/0057364 A1* | 2/2020 | Liao | G03F 7/70033 |

* cited by examiner

*Primary Examiner* — Kiet T Nguyen
(74) *Attorney, Agent, or Firm* — Maschoff Brennan

(57) ABSTRACT

An apparatus includes an extreme ultraviolet light source vessel having an intermediate focus, a scanner having a light source aperture, and a deflection module arranged between the intermediate focus and the light source aperture. The deflection module includes a first electrode plate and a second electrode plate, configured to create an electric field therebetween. Tin particles moving from the intermediate focus to the light source aperture passes through the deflection module, and are deflected by the electric field therein.

20 Claims, 11 Drawing Sheets

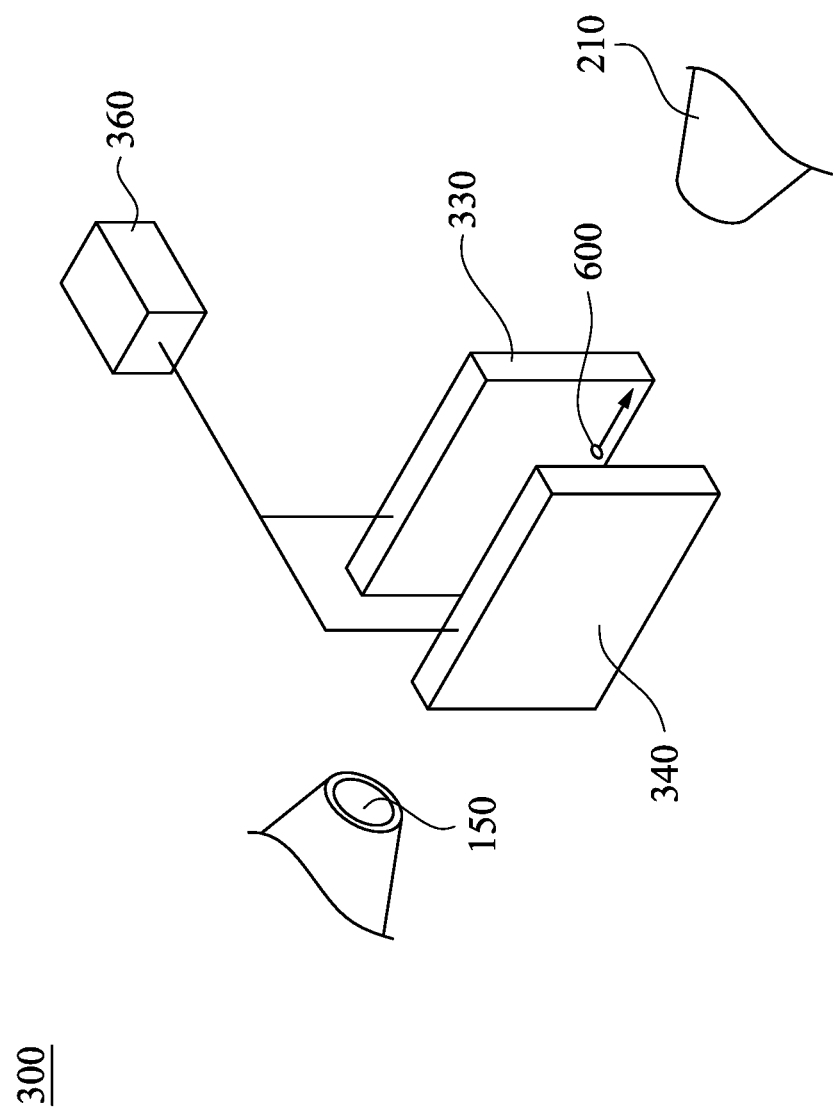

LITHOGRAPHY APPARATUS AND METHOD FOR USING THE SAME

BACKGROUND

Lithography apparatuses are used for imaging patterns onto wafer substrates, thereby patterning a photoresist layer on the wafer substrate. The photoresist layer can then be selectively etched according to the patterned image. Specifically, lithography apparatuses that use extreme ultraviolet light for imaging have an extreme ultraviolet light source vessel. The extreme ultraviolet light source vessel can use a laser beam to excite tin particles inside a chamber of the extreme ultraviolet light source vessel, such that extreme ultraviolet light is created.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B a deflection module according to some embodiments of the present disclosure.

DETAILED DESCRIPTION

Figure 1:
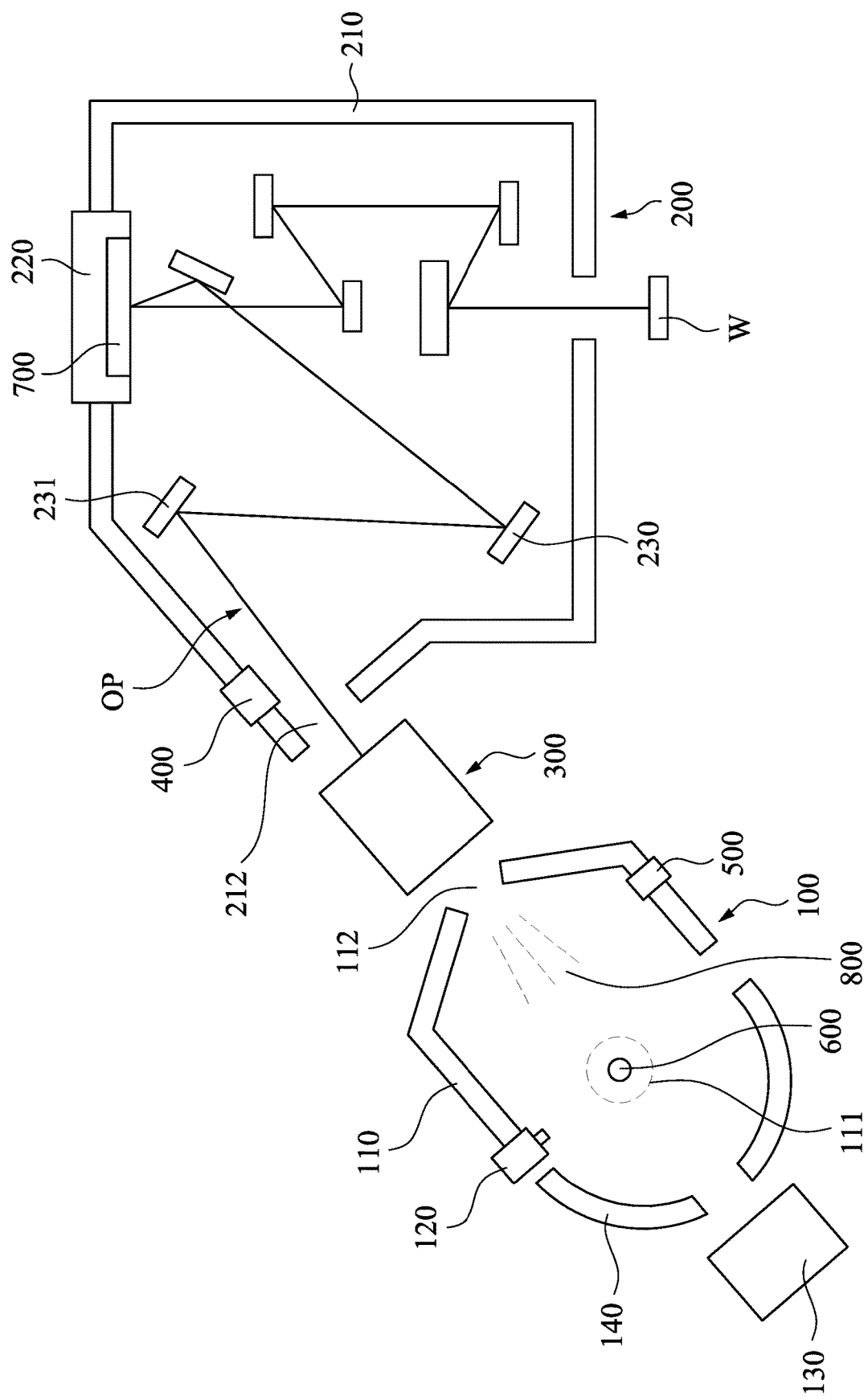
FIG. 1 shows an apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to an apparatus and a method for deflecting tin particles moving from an extreme ultraviolet light source vessel to an extreme ultraviolet light scanner. In particular, the present disclosure relates to a device and a method for deflecting electrically charged tin particles by using an electric field and/or a magnetic field.

FIG. 1 shows an apparatus 1000 according to some embodiments of the present disclosure. The apparatus 1000 includes an extreme ultraviolet light source vessel 100, a scanner 200, and a deflection module 300. The extreme ultraviolet light source vessel 100 includes a chamber 110, a droplet generator 120, a laser focusing system 130, and a collector 140. Tin is heated in the droplet generator 120 above the melting point (about 231.9° C.) of tin and liquefied. The liquefied tin is ejected at high pressure from the droplet generator 120 such that liquid tin particles fly toward an excitation region 111 in the chamber 110 of the extreme ultraviolet light source vessel 100.

In some embodiments of the present disclosure, the laser focusing system 130 focuses a high power laser beam at the excitation region 111 inside the chamber 110 of the extreme ultraviolet light source vessel 100. The tin particles are fed to the excitation region 111 by the droplet generator 120. The tin particles are hit by the high power laser beam at the excitation region 111. As tin particles are hit by the high power laser beam, the tin particles absorbs energy from the high power laser beam and a laser produced plasma which is hot and dense is created. Extreme ultraviolet light is emitted from the laser produced plasma due to the excitation. In some embodiments of the present disclosure, the generated extreme ultraviolet light has a wavelength between about 5 and about 15 nanometers. Thereby, extreme ultraviolet light is generated inside the chamber 110 of the extreme ultraviolet light source vessel 100. Since extreme ultraviolet light is absorbed by most matter, the chamber 110 can be a vacuum environment.

In some embodiments of the present disclosure, the collector 140 and an intermediate focus 112 of the chamber 110 are arranged at two opposite sides of the excitation region 111. In some embodiments, the intermediate focus 112 is an exit of the chamber 110, and the extreme ultraviolet light exits the chamber 110 from the exit (i.e., the intermediate focus 112) and enters the scanner 200 through the deflection module 300. The collector 140 is coated with a multilayer reflector including alternating layers of different materials. The alternating layers of materials reflect light by interlayer interference. The collector 140 is configured to reflect the extreme ultraviolet light produced by the excited tin droplets at the excitation region 111 toward the intermediate focus 112. The extreme ultraviolet light then passes through the intermediate focus 112 to the scanner 200.

The scanner 200 is an extreme ultraviolet light scanner 200, and includes a scanner chamber 210 having a light source aperture 212, a reticle holder 220 for accommodating a reticle mask 700, and a plurality of optical mirrors 230. The light source aperture 212 is aligned with the intermediate focus 112 of the chamber 110 of the extreme ultraviolet light source vessel 100. Extreme ultraviolet light produced in the extreme ultraviolet light source vessel 100 passes through the intermediate focus 112 into the scanner 200 through the light source aperture 212. The reticle holder 220 is configured to accommodate a reticle mask 700 having a pattern to be imaged onto a wafer W. The optical mirrors 230 are reflective mirrors for reflecting extreme ultraviolet light, and are configured to reflect and direct light from the extreme ultraviolet light source vessel 100 to the reticle mask 700 accommodated on the reticle holder 220, and from the reticle mask 700 to a wafer to be patterned with the image of the reticle mask 700. In other words, the optical mirrors 230 and the reticle mask 700 accommodated on the reticle holder 220 are configured to reflect extreme ultraviolet light along an optical path OP from the intermediate focus 112 of the extreme ultraviolet light source vessel 100 to the wafer W. Specifically, a first optical mirror 231 of the optical mirrors 230 is configured to receive extreme ultraviolet light produced in the extreme ultraviolet light source vessel 100 and transmitted out of the intermediate focus 112, and reflect the extreme ultraviolet light with certain pupil image shape to subsequent optical mirrors 230 and the reticle mask 700.

In addition to the extreme ultraviolet light, operation of the extreme ultraviolet light source vessel 100 produces electrically charged tin particles, which can travel from the extreme ultraviolet light source vessel 100, through the light source aperture 212, and into the extreme ultraviolet light scanner 200. Specifically, the tin particles, or tin debris, can travel and hit any of the optical mirrors 230 in the extreme ultraviolet light scanner 200, and the reticle mask 700 accommodated on the reticle 220 of the extreme ultraviolet light scanner 200. A reticle mask 700 contaminated by tin particles compromises the image patterned onto the wafer. Therefore, preventing the tin particles from hitting the reticle mask 700 accommodated on the reticle 220 preserves the integrity of the image patterned onto the wafer. After being hit by the high power laser beam, electrons on the tin particle can become free electrons, and thus the tin particle can become positively charged. In some embodiments of the present disclosure, hydrogen gas 800 flows inside the chamber 110 to remove the tin particles from the chamber 110, such that contamination of the collector 140 by the tin particles is reduced. Furthermore, the hydrogen gas 800 can reduce the amount of tin particles that travels from the chamber 110 to the scanner chamber 210. The hydrogen gas 800 inside the chamber 110 can be excited by the extreme ultraviolet light created therein, and become hydrogen plasma having free electrons. Tin particles 600 passing through said hydrogen plasma can attract these electrons and become negatively charged, before moving through the intermediate focus 112. Therefore, tin particles 600 moving from the intermediate focus 112 to the light source aperture 212 can be positively charged, or negatively charged.

The deflection module 300 is arranged between the intermediate focus 112 of the extreme ultraviolet light source vessel 100, and the light source aperture 212 of the extreme ultraviolet light scanner 200. Specifically, the deflection module 300 is arranged between the intermediate focus 112 of the extreme ultraviolet light source vessel 100 and the reticle holder 220 of the extreme ultraviolet light scanner 200. In other words, a tin particle traveling from the intermediate focus 112 of the extreme ultraviolet light source vessel 100 toward the light source aperture 210, the optical mirrors 230, and the reticle holder 220 of the scanner 200 first passes through the deflection module 300.

Figure 2A:
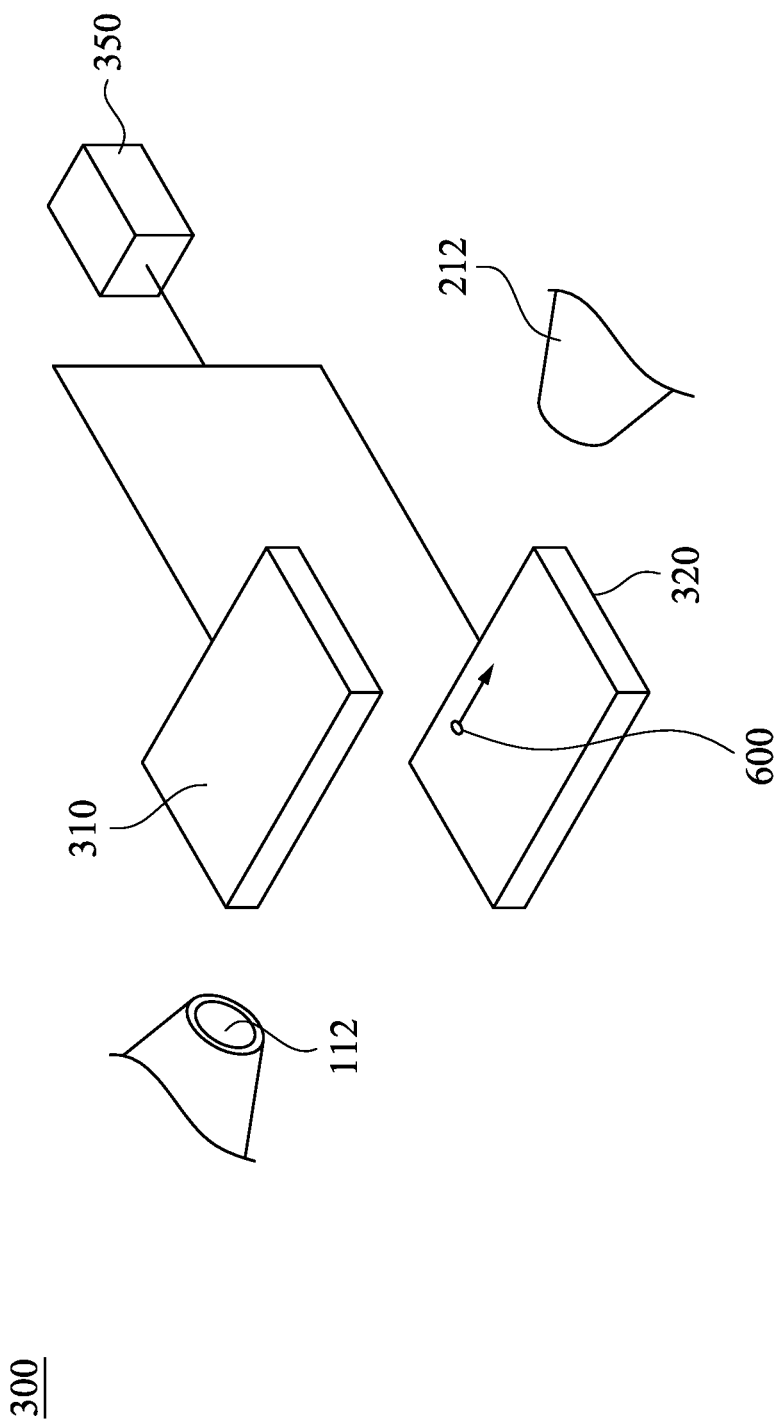
FIGS. 2A and 2B a deflection module according to some embodiments of the present disclosure.

FIG. 2A is a perspective view of the deflection module 300 of FIG. 1 according to some embodiments of the present disclosure. The deflection module 300 includes a first electrode plate 310, a second electrode plate 320, and an electric field controller 350 connected to the first electrode plate 310 and the second electrode plate 320. The tin particle 600 travelling from the intermediate focus 112 of the extreme ultraviolet light source vessel 100 to the light source aperture 212 of the scanner 200 passes in between the first electrode plate 310 and the second electrode plate 320 of the deflection module 300. In operation, the first electrode plate 310 and the second electrode plate 320 can be configured to be oppositely charged, thereby creating an electric field therebetween. The electrically charged tin particle 600 is subjected to an electrical force as it travels between the first electrode plate 310 and the second electrode plate 320.

Figure 2B:
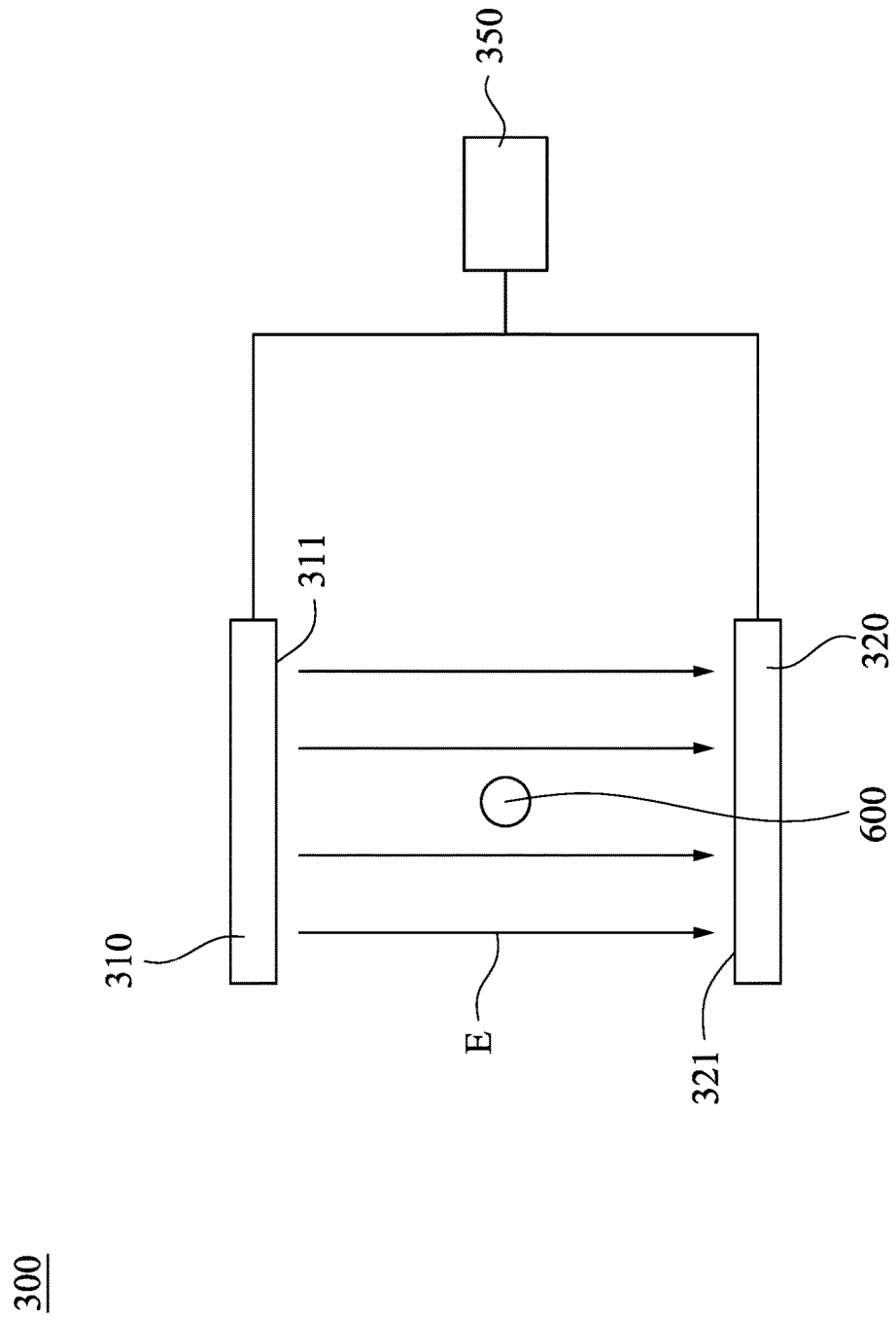

FIG. 2B is a side view of the deflection module 300 in a direction from the intermediate focus 112 of the extreme ultraviolet light source vessel 100 to the light source aperture 212 of the scanner 200, namely in the direction of extreme ultraviolet light traveling from the extreme ultraviolet source vessel 100 into the scanner 200. The first electrode plate 310 can be positively charged, and the second electrode plate 320 can be negatively charged, such that electric field lines E extend from the first electrode plate 310 to the second electrode plate 320. An electric force acts on a charged particle according to the following equation:

$$F=qE$$

wherein F is the electric force (in vector form) acting on the charged particle, q is the charge on the charged particle, and E is the electric field (in vector form). The direction of the electric field lines E is downward. Thus, the electric force on a positively charged tin particle 600 is directed downward toward the second electrode plate 320. Conversely, the electric force on a negatively charged tin particle 600 is directed upward toward the first electrode plate 310. Namely, a positively charged tin particle 600 is deflected downward by the electrical force, and a negatively charged tin particle 600 is deflected upward by the electrical force, such that the deflected tin particle 600 does not hit the reticle 220 of the scanner 200.

Alternately in some embodiments of the present disclosure, the first electrode plate 310 can be negatively charged, and the second electrode plate 320 can be positively charged, such that the electric field lines E extend from the second electrode plate 320 to the first electrode plate 310. A positively charged tin particle 600 is deflected upward by the electrical force, and a negatively charged tin particle 600 is deflected downward by the electrical force, such that the deflected tin particle 600 does not hit the reticle holder 220 of the scanner 200 (see FIG. 1).

In some embodiments of the present disclosure, the first electrode plate 310 and the second electrode plate 320 are substantially parallel to each other. Specifically, the first electrode plate 310 has a first face 311 facing the second electrode plate 320, the second electrode plate 320 has a second face 321 facing the first electrode plate 310, and the first face 311 of the first electrode plate 310 and the second face 321 of the second electrode plate 320 are substantially parallel. The electric field lines E of the electric field are substantially parallel to each other, and are substantially perpendicular to the first face 311 of the first electrode and substantially perpendicular to the second face 321 of the second electrode plate 320. The first electrode plate 310 and the second electrode plate 320 can act as capacitance plates, and the electric field created therebetween can be similar to that of a parallel plate capacitor.

In some embodiments of the present disclosure, a particle trap device 400 (see FIG. 1) is arranged in the scanner 200 or in the deflection module 300, and along an expected flight path of the tin particle 600 after being deflected. The particle trap device 400 is configured to receive the deflected tin particle 600. For example, as shown in FIG. 2A, the tin particle 600 is deflected by the electric force and then enters the particle trap device 400. As such, the tin particle 600 would not impinge on the optical mirrors 230 and/or the reticle mask 700.

Referring to FIG. 1, in some embodiments of the present disclosure, an ultraviolet light source device 500 is configured to excite hydrogen gas 800 at a region between the excitation region 111, where the tin particle 600 is excited by the laser beam, and the intermediate focus 112. The hydrogen gas 800 excited by ultraviolet light becomes hydrogen plasma having free electrons. Tin particles 600 passing through said hydrogen plasma can attract these electrons and become negatively charged, before moving through the intermediate focus 112 and into the deflection module 300. With such configuration, the hydrogen gas 800 is more consistently excited to become hydrogen plasma, and the tin particle 600 is more consistently negatively charged, such that the deflection of the tin particle under the electric field and the magnetic field is more easily controlled.

FIG. 3A is a perspective view of the deflection module 300 according to some other embodiments of the present disclosure. The deflection module 300 includes a first magnet 330 and a second magnet 340. The tin particle 600 travelling from the intermediate focus 112 of the extreme ultraviolet light source vessel 100 to the light source aperture 212 of the scanner 200 passes in between the first magnet 330 and the second magnet 340 of the deflection module 300. Each of the first magnet 330 and the second magnet 340 can be a permanent magnet, or an electromagnet, such that a magnetic field is created between the first magnet 330 and the second magnet 340. In some embodiments, the deflection module 300 further includes a magnetic field controller 360 connected to the first magnet 330 and the second magnet 340 when the first magnet 330 and the second magnet 340 are electromagnets. The magnetic field controller 360 is configured to control an intensity of the magnetic field by tuning currents of the electromagnets. The electrically charged tin particle 600 is subjected to a magnetic force as it travels between the first magnet 330 and the second magnet 340, from the intermediate focus 112 toward the light source aperture 212.

Figure 3B:
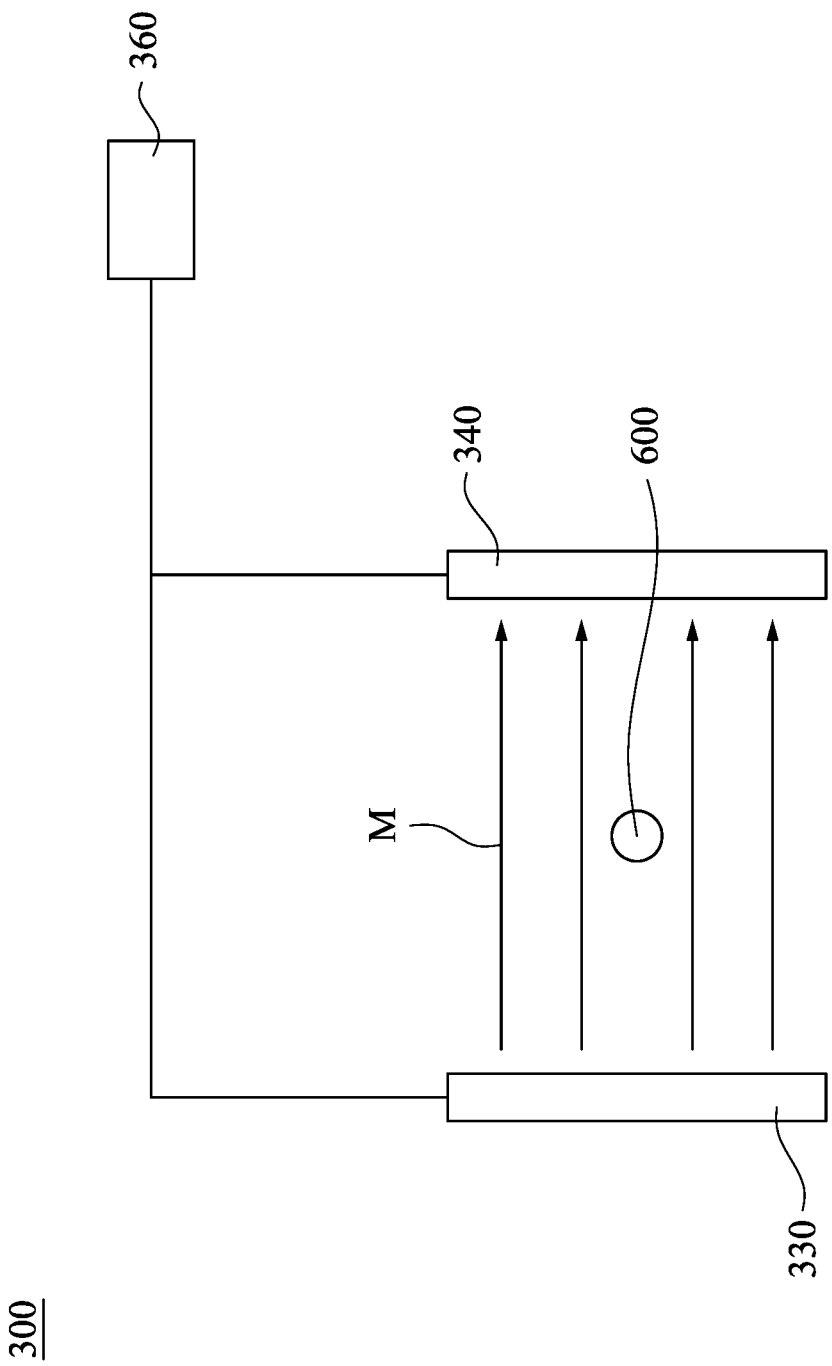

FIG. 3B is a side view of the deflection module 300 in a direction from the intermediate focus 112 of the extreme ultraviolet light source vessel 100 to the light source aperture 210 of the scanner 200, namely in the direction of extreme ultraviolet light traveling from the extreme ultraviolet source vessel 100 into the scanner 200. A north pole of the first magnet 330 can face the second magnet 340, and a south pole of the second magnet 340 can face the first magnet 330, such that magnetic field lines M extend from the first magnet 330 to the second magnet 340, from left to right. A magnetic force acts a moving charged particle as according to the following equation:

$$F=qv \times B$$

where F is the magnetic force (in vector form) acting on the moving charged particle, q is the charge on the moving charged particle, v is the velocity (in vector form) of the moving charged particle, and B is the magnetic field (in vector form). For the tin particle 600 moving from the intermediate focus 112 toward, the light source aperture 212, the velocity of the tin particle 600 is into the page. The direction of the magnetic field lines M is from left to right. Thus, the magnetic force on a positively charged tin particle 600 moving away from the intermediate focus 150 toward the light source aperture 210 is directed downward. Conversely, the magnetic force on a negatively charged tin particle 600 moving away from the intermediate focus 150 toward the light source aperture 210 is directed upward. Namely, a positively charged tin particle 600 is deflected downward by the magnetic force, and a negatively charged tin particle 600 is deflected upward by the magnetic force, such that the deflected tin particle 600 does not hit the reticle 220 of the scanner 200.

Alternately in some embodiments of the present disclosure, a south pole of the first magnet 330 can face the second magnet 340, and a north pole of the second magnet 340 can face the first magnet 330, such that the magnetic field lines M extend from the second magnet 340 to the first magnet 330. A positively charged tin particle 600 is deflected upward by the magnetic force, and a negatively charged tin particle 600 is deflected downward by the magnetic force, such that the deflected tin particle 600 does not hit the reticle 220 of the scanner 200.

In some embodiments of the present disclosure, the first magnet 330 and the second magnet 340 are substantially parallel to each other. Specifically, the first magnet 330 has a first magnet face 331 facing the second magnet 340, the second magnet 340 has a second magnet face 341 facing the first magnet 330, and the first magnet face 331 and the second magnet face 341 are substantially parallel. The magnetic field lines M of the magnet field are substantially parallel to each other, and are substantially perpendicular to the first magnet face 331 and substantially perpendicular to the second magnet face 341.

Figure 4A:
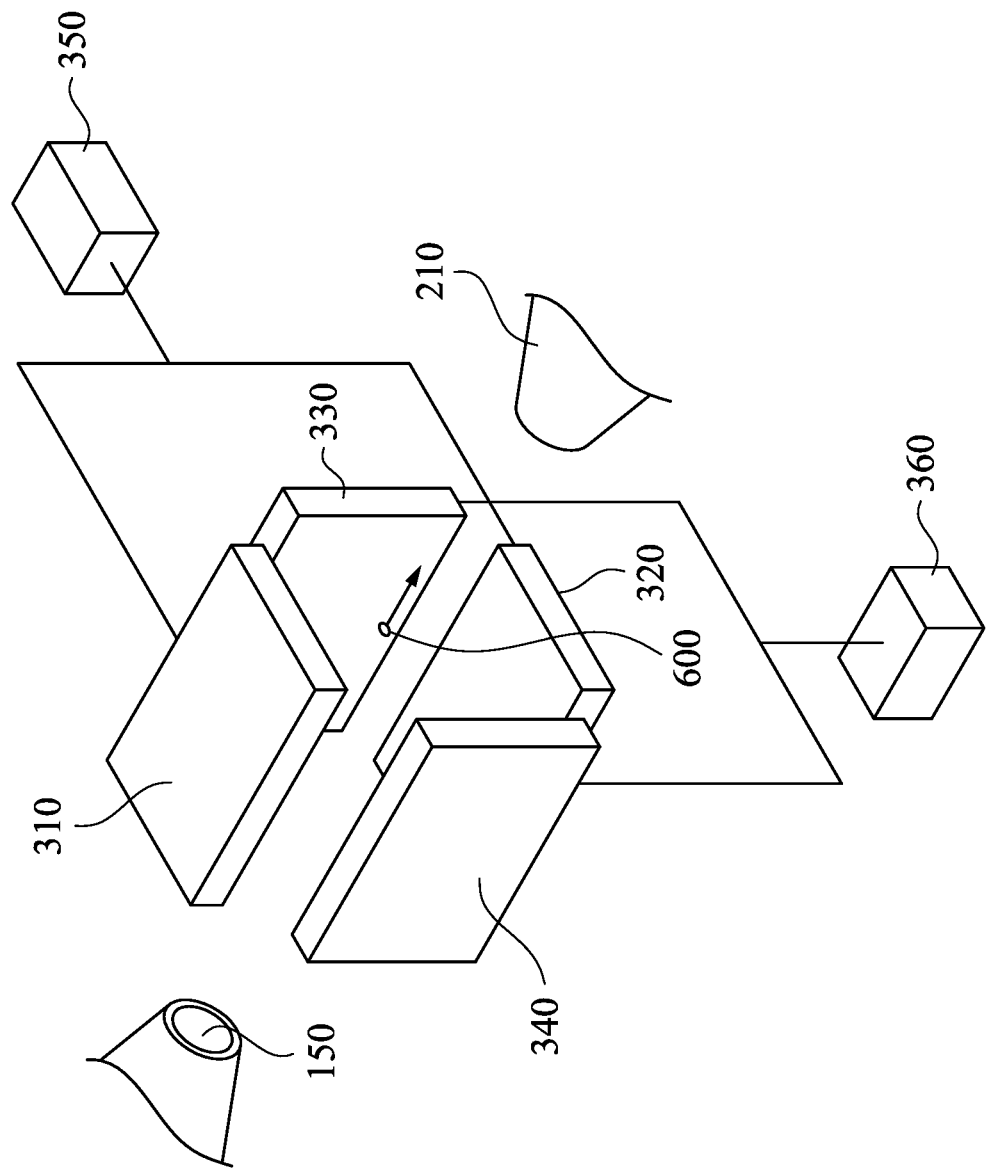
FIGS. 4A and 4B a deflection module according to some embodiments of the present disclosure.

FIG. 4A is a perspective view of the deflection module 300 of FIG. 1 according to some other embodiments of the present disclosure. The deflection module 300 includes the first electrode plate 310, the second electrode plate 320, the first magnet 330, the second magnet 340, and the electric field controller 350, similar to those described above. The electrically charged tin particle 600 moving through the deflection module 300 is subject to an electric force from an electric field created by the first electrode plate 310 and the second electrode plate 320, and is also subject to a magnetic force from a magnetic field created by the first magnet 330 and the second magnet 340.

Figure 4B:
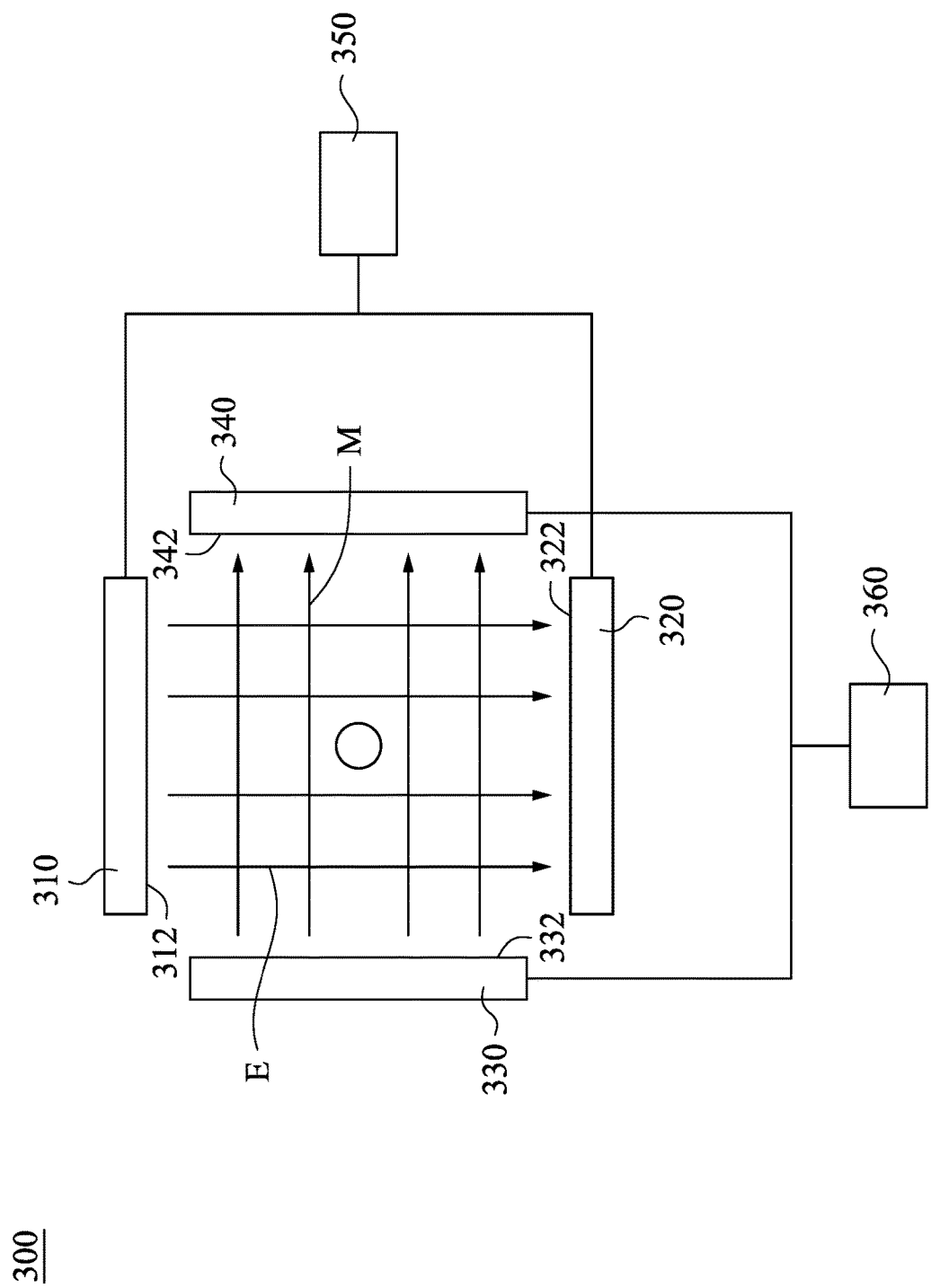

FIG. 4B is a side view of the deflection module 300 in a direction from the intermediate focus 112 of the extreme ultraviolet light source vessel 100 to the light source aperture 212 of the scanner 200, namely in the direction of extreme ultraviolet light traveling from the extreme ultraviolet source vessel 100 into the scanner 200. The first electrode plate 310 is positively charged. The second electrode plate 320 is negatively charged. The first magnet 330 has a north pole facing the second magnet 340. The second magnet 340 has a south pole facing the first magnet 330. The first electrode plate 310, the second electrode plate 320, the first magnet 330, and the second magnet 340 are arranged around a flight path of a tin particle 600 passing through the deflection module 300. Specifically, the arrangement of the electromagnetic units in a clock-wise order, starting from the first magnet 330, is the first magnet 330, the first electrode plate 310, the second magnet 340, and the second electrode plate 320. The first magnet face 331 of the first magnet 330 and the second magnet face 341 of the second magnet 340 are arranged perpendicular to the first face 311 of the first electrode plate 310 and the second face 321 of the second electrode plate 320, such that the magnetic field lines M and the electric field lines E intersect and are substantially perpendicular to each other.

When the first electrode plate 310 is positively charged and the second electrode plate 320 is negatively charged, the electric field lines E extend from the first electrode plate 310 to the second electrode plate 320. Therefore, a positively charged tin particle 600 is deflected toward the second electrode plate 320, and a negatively charged tin particle 600 is deflected toward the first electrode plate 310.

When the first magnet 330 has a north pole facing the second magnet 340, and the second magnet 340 has a south pole facing the first magnet 330, the magnetic field lines M extend from the first magnet 330 to the second magnet 340. Therefore, a positively charged tin particle 600 moving from the intermediate focus 150 toward the light source aperture 210 is deflected toward the second electrode plate 320, and a negatively charged tin particle 600 moving in the same direction is deflected toward the first electrode plate 310.

The electric field created by the first electrode plate 310 and the second electrode plate 320, and the magnetic field created by the first magnet 330 and the second magnet 340, act on a charged particle moving from the intermediate focus 150 toward the light source aperture 210 in the same direction. By applying both an electric force and a magnetic force on the charged tin particle 600 moving through the deflection module 300 from the extreme ultraviolet light source vessel 100 to the scanner 200, each of the electric force and the magnetic force can be smaller while deflecting the moving and charged tin particle 600 sufficiently off path, such that the tin particle 600 does not hit the reticle mask 700 arranged on the reticle holder 220 of the scanner 200. Specifically, by applying both an electric field and a magnetic field on the charged tin particle 600 moving through the deflection module 300, the length of the first and second magnets 330, 340 and the length of the first and second electrode plates 310, 320 can be shortened, while still deflecting the moving tin particle 600 by a sufficient degree due to the cumulative effects of the electric field and the magnetic field. Further, the magnetic field can lower the demanding of the electric field amplitude. This can prevent from arcing or gas ionization due to high voltage difference, enhancing the deflection capability beyond the limitation of electric field amplitude.

Alternately in some other embodiments of the present disclosure, the first electrode plate 310 can be negatively charged, the second electrode plate 320 can be positively charged, the first magnet 330 has the south pole thereof facing the second magnet 340, and the second magnet 340 has the north pole thereof facing the first magnet 330. The first electrode plate 310, the second electrode plate 320, the first magnet 330, and the second magnet 340 are arranged around a flight path of a tin particle 600 passing through the deflection module 300. Specifically, the arrangement of the electromagnetic units in a clock-wise order, starting from the first magnet 330, is the first magnet 330, the first electrode plate 310, the second magnet 340, and the second electrode plate 320. The first magnet face 331 of the first magnet 330 and the second magnet face 341 of the second magnet 340 are arranged perpendicular to the first face 311 of the first electrode plate 310 and the second face 321 of the second electrode plate 320, such that the magnetic field lines M and the electric field lines E intersect and are substantially perpendicular to each other.

When the first electrode plate 310 is negatively charged and the second electrode plate 320 is positively charged, the electric field lines E extend from the second electrode plate 320 to the first electrode plate 310. Therefore, a positively charged tin particle 600 is deflected toward the first electrode plate 310, and a negatively charged tin particle 600 is deflected toward the first second plate.

When the first magnet 330 has a south pole facing the second magnet 340, and the second magnet 340 has a north pole facing the first magnet 330, the magnetic field lines M extend from the second magnet 340 to the first magnet 330. Therefore, a positively charged tin particle 600 moving from the intermediate focus 150 toward the light source aperture 210 is deflected toward the first electrode plate 310, and a negatively charged tin particle 600 moving in the same direction is deflected toward the second electrode plate 320.

The electric field created by the first electrode plate 310 and the second electrode plate 320, and the magnetic field created by the first magnet 330 and the second magnet 340, act on a charged particle moving from the intermediate focus 150 toward the light source aperture 210 in the same direction.

Note that under this arrangement, similar to the embodiments described above, when viewed in the direction from the intermediate focus 112 to the light source aperture 212, namely in the direction of extreme ultraviolet light, the electromagnetic units are arranged around the flight path of the charged tin particle 600, in the following clock-wise order: the magnet having a north pole facing the tin flight path, the electrode plate having a positive charge, the magnet having a south pole facing the tin flight path, and the electrode having a negative charge. Specifically, the arrangement can be in clock-wise order, the first magnet 330 having a north pole facing the tin flight path, the first electrode plate 310 having a positive charge, the second magnet 340 having a south pole facing the tin flight path, and the second electrode having a negative charge. As described above, the electric force created by the first and second electrode plates 310, 320 and the magnetic force created by the first and second magnets 330, 340 act on the charged tin particle 600 moving away from the intermediate focus 150 in the same direction. In this arrangement, the first magnet 330 can be at the left of the tin flight path, over the tin flight path, at the right of the tin flight path, or below the tin flight path, as long as the overall clock-wise order is maintained. Namely, the first electrode plate 310 can be over the tin flight path, at the right of the tin flight path, below the tin flight path, or at the left of the tin flight path, respectively. The second magnet 340 can be at the right of the tin flight path, below the tin flight path, at the left of the tin flight path, or over the tin flight path, respectively. The second electrode plate 320 can be below the tin flight path, at the left of the tin flight path, over the tin flight path, or at the right of the tin flight path, respectively.

Alternately, the arrangement can be in clock-wise order, the second magnet 340 having a north pole facing the tin flight path, the second electrode having a positive charge, the second magnet 340 having a south pole facing the tin flight path, and the second electrode having a negative charge. Likewise, the electric force created by the first and second electrode plates 310, 320 and the magnetic force created by the first and second magnets 330, 340 act on the charged tin particle 600 moving away from the intermediate focus 150 in the same direction. In this arrangement, the second magnet 340 can be at the left of the tin flight path, over the tin flight path, at the right of the tin flight path, or below the tin flight path, as long as the overall clock-wise order is maintained. Namely, the second electrode plate 320 can be over the tin flight path, at the right of the tin flight path, below the tin flight path, or at the left of the tin flight path, respectively. The first magnet 330 can be at the right of the tin flight path, below the tin flight path, at the left of the tin flight path, or over the tin flight path, respectively. The first electrode plate 310 can be below the tin flight path, at the left of the tin flight path, over the tin flight path, or at the right of the tin flight path, respectively.

Figure 5:
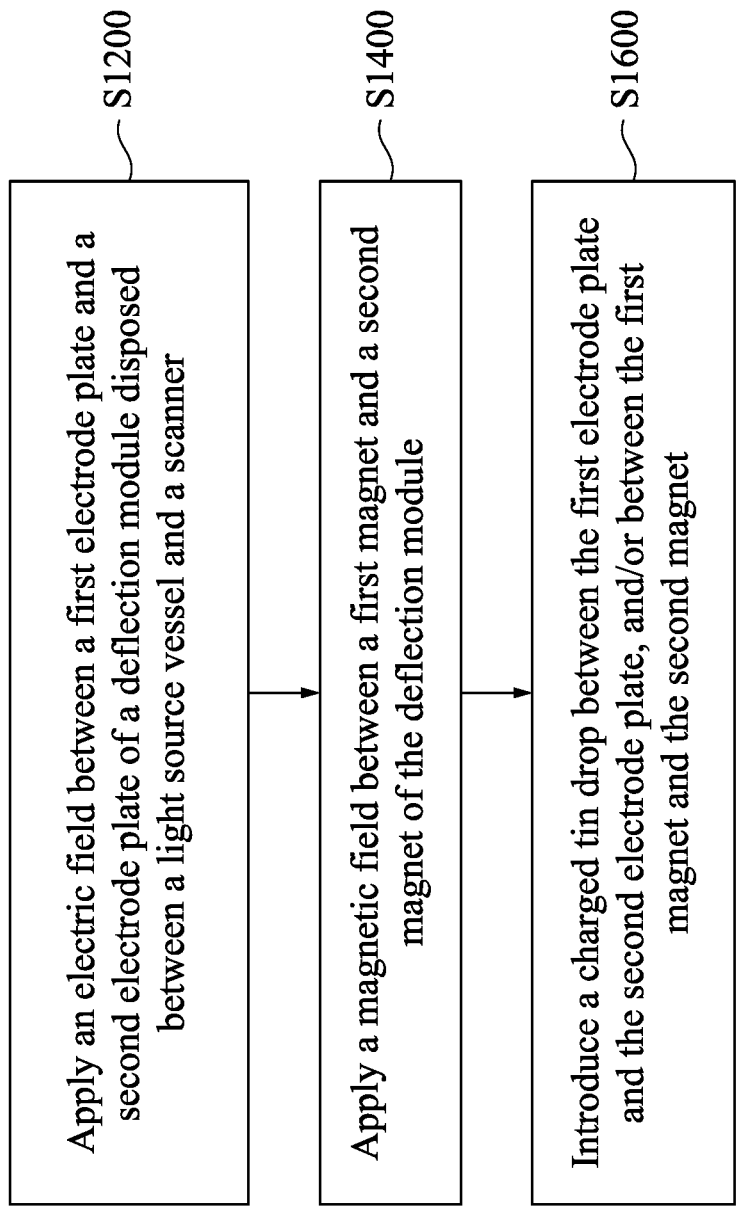
FIG. 5 shows a flowchart of a method according to some embodiments of the present disclosure.

FIG. 5 shows a flowchart of a method according to some embodiments of the present disclosure. The method is merely an example and is not intended to limit the present disclosure beyond what is explicitly recited in the claims. Additional operations can be provided before, during, and after the method, and some operations described can be replaced, eliminated, or moved around for additional embodiments of the process. For clarity and ease of explanation, some elements of the figures have been simplified.

In operation S1200, an electric field is applied between a first electrode plate and a second electrode plate of a deflection module disposed between an extreme ultraviolet light source vessel and a scanner. As shown in FIG. 2B, the first electrode plate 310 can be positively charged, and the second electrode plate 320 can be negatively charged, such that electric field lines E extend from the first electrode plate 310 to the second electrode plate 320. Alternately in some embodiments of the present disclosure, the first electrode plate 310 can be negatively charged, and the second electrode plate 320 can be positively charged, such that the electric field lines E extend from the second electrode plate 320 to the first electrode plate 310.

In some embodiments of the present disclosure, the first electrode plate 310 and the second electrode plate 320 are substantially parallel to each other. Specifically, the first electrode plate 310 has a first face 311 facing the second electrode plate 320, the second electrode plate 320 has a second face 321 facing the first electrode plate 310, and the first face 311 of the first electrode plate 310 and the second face 321 of the second electrode plate 320 are substantially parallel. The electric field lines E of the electric field are substantially parallel to each other, and are substantially perpendicular to the first face 311 of the first electrode and substantially perpendicular to the second face 321 of the second electrode. The first electrode plate 310 and the second electrode plate 320 can act as capacitance plates, and the electric field created therebetween can be similar to that of a parallel plate capacitor.

In some embodiments, the electric field controller 350 is configured to apply a electrical signals to the first electrode plate 310 and the second electrode plate 320 to generate a voltage between the electric field controller 350. In some embodiments, the electric field controller 350 starts applying electrical signals to the first electrode plate 310 and the second electrode plate 320 prior to the droplet generator 120 generates the tin particles or the laser beam of the laser focusing system 130 is focused on the tin particles. In some embodiments, the electric field controller 350 stops applying electrical signals to the first electrode plate 310 and the second electrode plate 320 after the droplet generator 120 stops generating the tin particles or the laser focusing system 130 stops emitting the laser beam.

In some embodiments, the electric field controller 350 controls the voltage between the electric field controller 350 to tune the deflection angle of the tin particles 600. For example, the voltage is increased when the tin particles 600 carries less carriers (holes or electrons), and the voltage is decreased when the tin particles 600 carries more carriers. Further, the voltage can be decreased when the gas source device 500 excites the hydrogen gas 800.

In operation S1400, optionally, a magnetic field is applied between a first magnet 330 and a second magnet 340 of the deflection module. The first magnet 330 can have a north pole facing the second magnet 340, and the second magnet 340 can have a south pole facing the first magnet 330, such that magnetic field lines M extend from the first magnet 330 to the second magnet 340. Alternately in some embodiments of the present disclosure, the first magnet 330 can have a south pole facing the second magnet 340, and the second magnet 340 can have a north pole facing the first magnet 330, such that magnetic field lines M extend from the second magnet 340 to the first magnet 330.

In some embodiments of the present disclosure, the first magnet 330 and the second magnet 340 are substantially parallel to each other. Specifically, the first magnet 330 has a first magnet 330 face facing the second magnet 340, the second magnet 340 has a second magnet 340 face facing the first magnet 330, and the first magnet 330 face and the second magnet 340 face are substantially parallel. The magnetic field lines M of the magnet field are substantially parallel to each other, and are substantially perpendicular to the first magnet 330 face and substantially perpendicular to the second magnet 340 face. Specifically, the first magnet 330 face of the first magnet 330 and the second magnet 340 face of the second magnet 340 are arranged perpendicular to the first face 311 of the first electrode plate 310 and the second face 321 of the second electrode plate 320, such that the magnetic field lines M and the electric field lines E intersect and are substantially perpendicular to each other.

In operation S1600, a charged tin particle 600 is introduced between the first electrode plate 310 and the second electrode plate 320, and/or between the first magnet 330 and the second magnet 340. The charged tin particle 600 is moving between the first electrode plate 310 and the second electrode plate 320, and between the first magnet 330 and the second magnet 340. The direction of movement of the tin particle 600 is in a length-wise direction of the first and second electrode plate 320s, and a length-wise direction of the first and second magnet 340s. Namely, a velocity of the tin particle 600 has a component perpendicular to the electric field lines E, and perpendicular to the magnetic field lines M.

Specifically, when viewing in the direction of the velocity component of the tin particle 600 that is perpendicular to the electric field lines E and the magnetic field lines M and the magnetic field lines M extend from left to right, the electric field lines E extend from top to down. In other words, when viewing in the direction of the velocity component of the tin particle 600 that is perpendicular to the electric field lines E and the magnetic field lines M, the direction of the electric field lines E point 90 degrees clockwise relative to the direction of the magnetic field lines M. In some embodiments, both the electric field and the magnetic field are pulsed for effective time gating.

A positively charged tin particle 600 is deflected by the electric field lines E in the direction of the electric field lines E. A negatively charged tin particle 600 is deflected in the direction opposite the direction of the electric field lines E. A moving and positively charged tin particle 600 is deflected by the magnetic field lines M in a direction 90 degrees clockwise from the direction of the electric field lines E, when viewing in the direction of the velocity vector of the moving tin particle 600. A moving and positively charged tin particle 600 is deflected by the magnetic field lines M in a direction 270 degrees clockwise from the direction of the electric field lines E, when viewing in the direction of the velocity vector of the moving tin particle 600. Therefore, an arrangement wherein the electric field lines E point 90 degrees clockwise relative to the direction of the magnetic field lines M when viewed in the direction of a charged tin particle 600 creates an electric force and a magnetic force on the tin particle 600 in a same direction.

Figure 6:
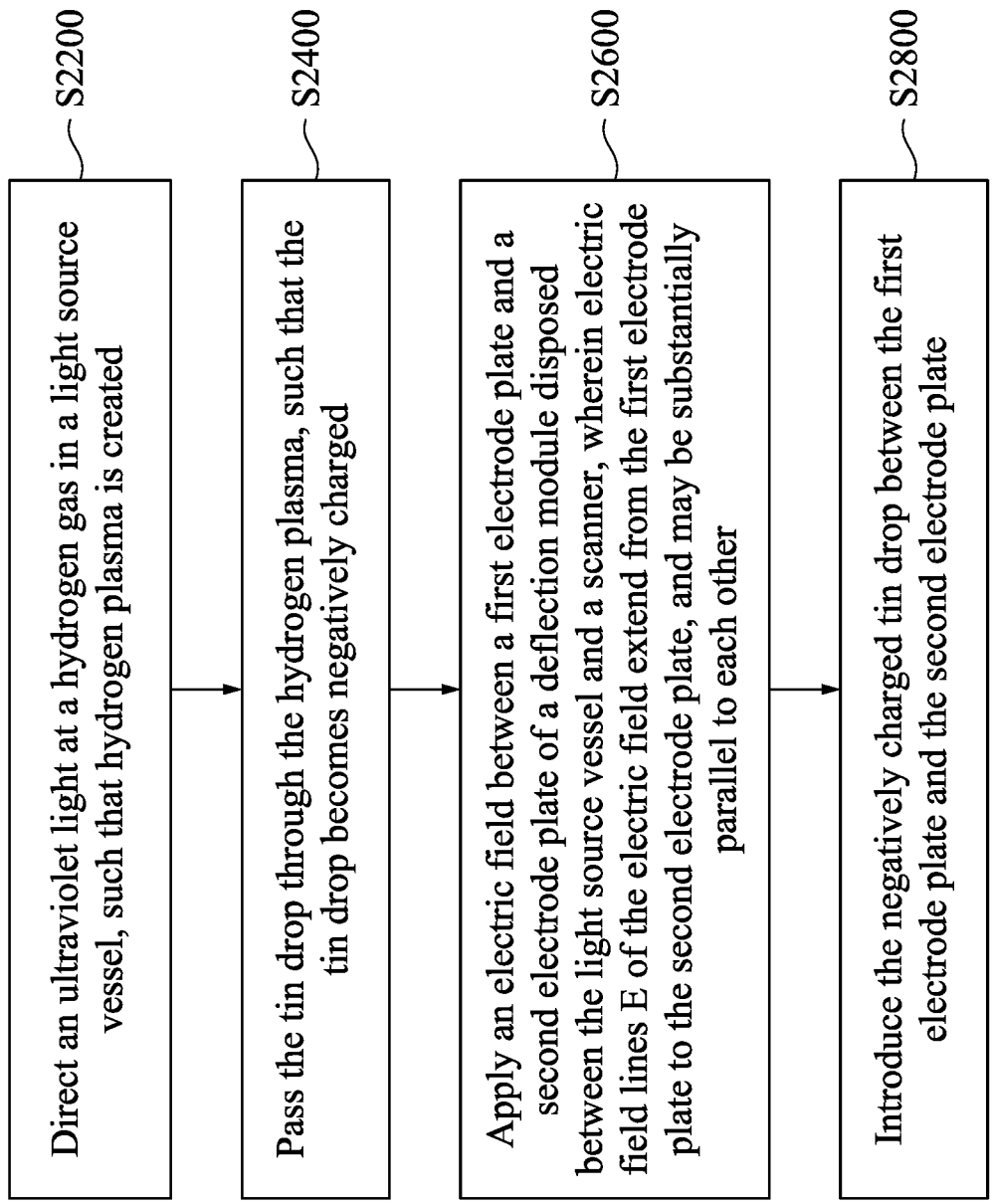
FIG. 6 shows a flowchart of a method according to some embodiments of the present disclosure.

FIG. 6 shows a flowchart of a method according to some embodiments of the present disclosure. In operation S2200, an ultraviolet light is directed at a hydrogen gas in an extreme ultraviolet light source vessel, such that hydrogen plasma is created. Specifically, as shown in FIG. 1, the ultraviolet light is directed at a hydrogen gas 800 inside a chamber 110 of an extreme ultraviolet light source vessel 100, at a region between an excitation region 111 and an intermediate focus 150 of the extreme ultraviolet light source vessel 100. Tin particles 600 are excited by a laser beam at the excitation region 111 for creating extreme ultraviolet light, and may travel toward the intermediate focus 150 and then into the light source aperture 210 of a scanner 200. By creating the hydrogen plasma at the region between the excitation region 111 and the intermediate focus 150, tin particles 600 moving toward the light source aperture 210 of the scanner 200 passes through the hydrogen plasma.

In operation S2400, the tin particle 600 is passed through the hydrogen plasma, such that the tin particle 600 becomes negatively charged. When tin particles 600 are excited by the extreme ultraviolet light, some lose electrons and become positively charged. Likewise, hydrogen plasma inside the chamber 110, created from hydrogen gas 800 excited by the extreme ultraviolet light, also has free electrons. When tin particles 600 pass through hydrogen plasma, the free electrons from the hydrogen plasma may attach to the tin particle 600, such that the tin particle 600 becomes negatively charged.

In other words, some tin particles 600 may be negatively charged, some tin particles 600 may be positively charged, and some tin particles 600 may be neutrally charged. For example, most of the tin particles 600 are negatively charged, and few of the tin particles 600 are positive charged. Tin particles 600 of different charges passing through the deflection module 300 described above are deflected by different magnitudes in different directions. By passing the tin particles 600 through the hydrogen plasma that is created by the ultraviolet light at the region between the excitation region 111 and the intermediate focus 150, the tin particles 600 become consistently charged and are therefore deflected by the deflection module 300 in a more consistent direction.

In some embodiments, electron beam can be heated (by using microwaves for example) and applied to the tin particles 600, such that heated electrons are adsorbed onto the tin particles 600 and the tin particles 600 are more negative. In some other embodiments, radio frequency waves or short wavelength lasers can be applied to hydrogen gases to ionize the hydrogen, increasing density of hydrogen plasma. With such configuration, the tin particles 600 can bring more negative electrons when they passes through the deflection module 300.

In operation S2600, an electric field is applied between a first electrode plate 310 and a second electrode plate 320 of a deflection module 300 disposed between an extreme ultraviolet light source vessel 100 and a scanner 200, wherein electric field lines E of the electric field extend from the first electrode plate 310 to the second electrode plate 320, and may be substantially parallel to each other. The electric field and the first and second electrode plate 320s are similar to those of the deflection module 300 described above, and not further described herein.

In operation S2800, the negatively charged tin particle 600 is introduced between the first electrode plate 310 and the second electrode plate 320. The velocity of the tin particle 600 has a component parallel to the electric field lines E. Specifically, the velocity component parallel to the electric field lines E is in a direction from the exit 112 of the extreme ultraviolet light source vessel 100 to the light source aperture 212 of the scanner 200. The electric field deflects the charged tin particle 600. Specifically, the negatively charged tin particle 600 is deflected in a direction against the direction of the electric field lines E.

Figure 7:
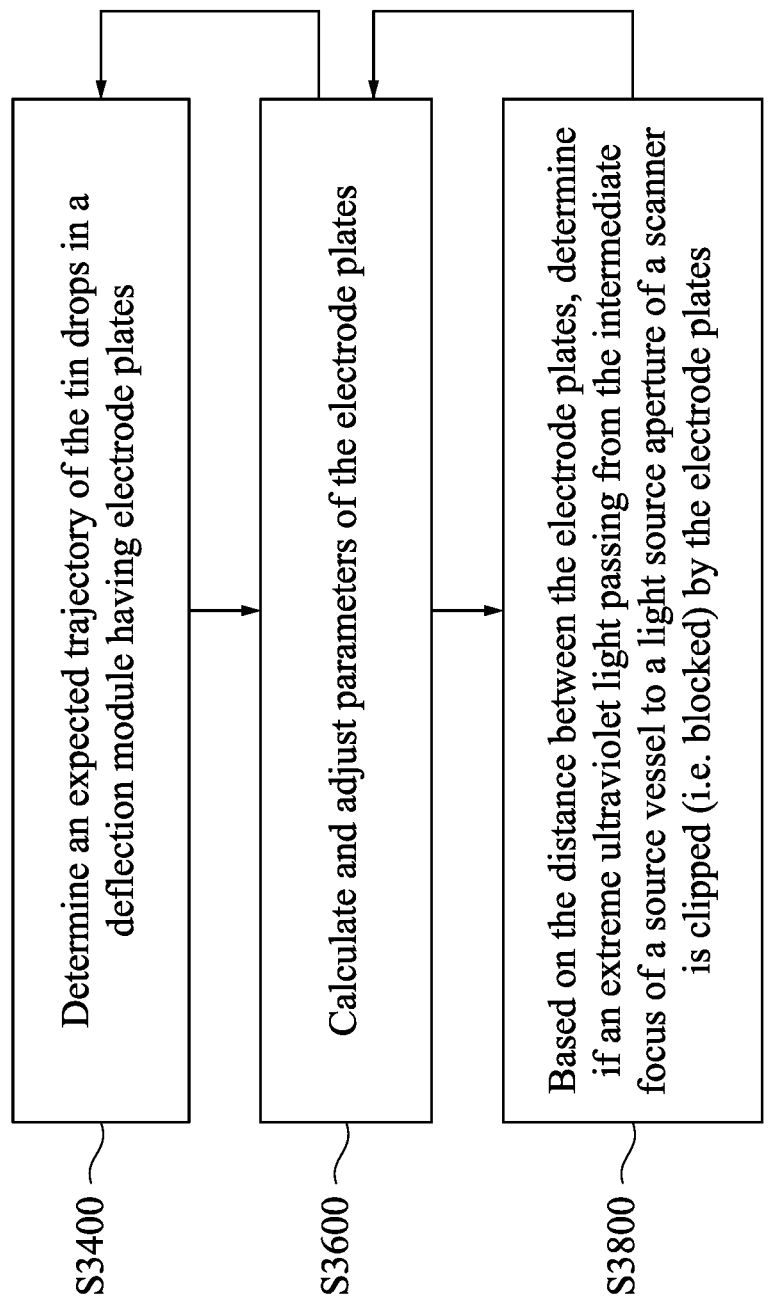
FIG. 7 shows a flowchart of a method according to some embodiments of the present disclosure.

FIG. 7 shows a flowchart of a method according to some embodiments of the present disclosure. Tin particles 600 moving from the intermediate focus 112 of the extreme ultraviolet light source vessel 100 to the light source aperture 212 of the scanner 200 have parameters, including charges of the tin debris, masses of the tin debris, and velocities of the tin debris. Specifically, the tin particles 600 can have an average charge, an average mass, and an average velocity.

In operation S3400, an expected trajectory of the tin particles 600 in a deflection module 300 having electrode plates can be determined. The electric field acts on the tin particle 600 with an electric force of $q*E$, wherein q is the charge of the tin particle 600 and E is the magnitude of the electric field. The acceleration due to the electric force is $q*E/m$, wherein m is the mass of the tin debris. The distance by which the tin particle 600 is deflected is $\frac{1}{2}*a*t$, wherein a is the acceleration described immediately above, and t is the time of the tin particle 600 between the electrode plates. Time of the tin particle 600 between the electrode plates is about a length-wise distance of the electrode plates divided by a velocity component of the tin particle 600 in the lengthwise direction of the electrode plates. Thus the expected deflection distance of the tin particle 600 depends on the strength of the electric field and the parameters of the tin particles 600 including the average charge, the average mass, and the average velocity of the tin particles 600.

In operation S3600, parameters of the electrode plates are calculated and adjusted. Specifically, parameters of the electrode plates include widths of the electrodes, lengths of the electrodes, charges of the electrodes, and a distance between the electrodes. For example, the electric field controller 350 described in FIG. 2A is configured to tune amounts of the charges in the electrode plates. Parameters of the electrode plates are calibrated such that hydrogen breakdown due to an excessively high electric field does not occur. The operation S3400 can be executed again to determine the expected trajectory of the charged tin particle 600 according to the adjusted parameters of the electrode plates.

In operation S3800, based on the distance between the electrode plates, determine if an extreme ultraviolet light passing from the intermediate focus 112 of the extreme ultraviolet light source vessel 100 to the light source aperture 210 of the scanner 200 is clipped (i.e. blocked) by the electrode plates. If one or both of the electrode plates blocks the extreme ultraviolet light from the intermediate focus 150, operation S3600 is executed such that the electrode plates are moved further apart so as to not block the extreme ultraviolet light.

Figure 8:
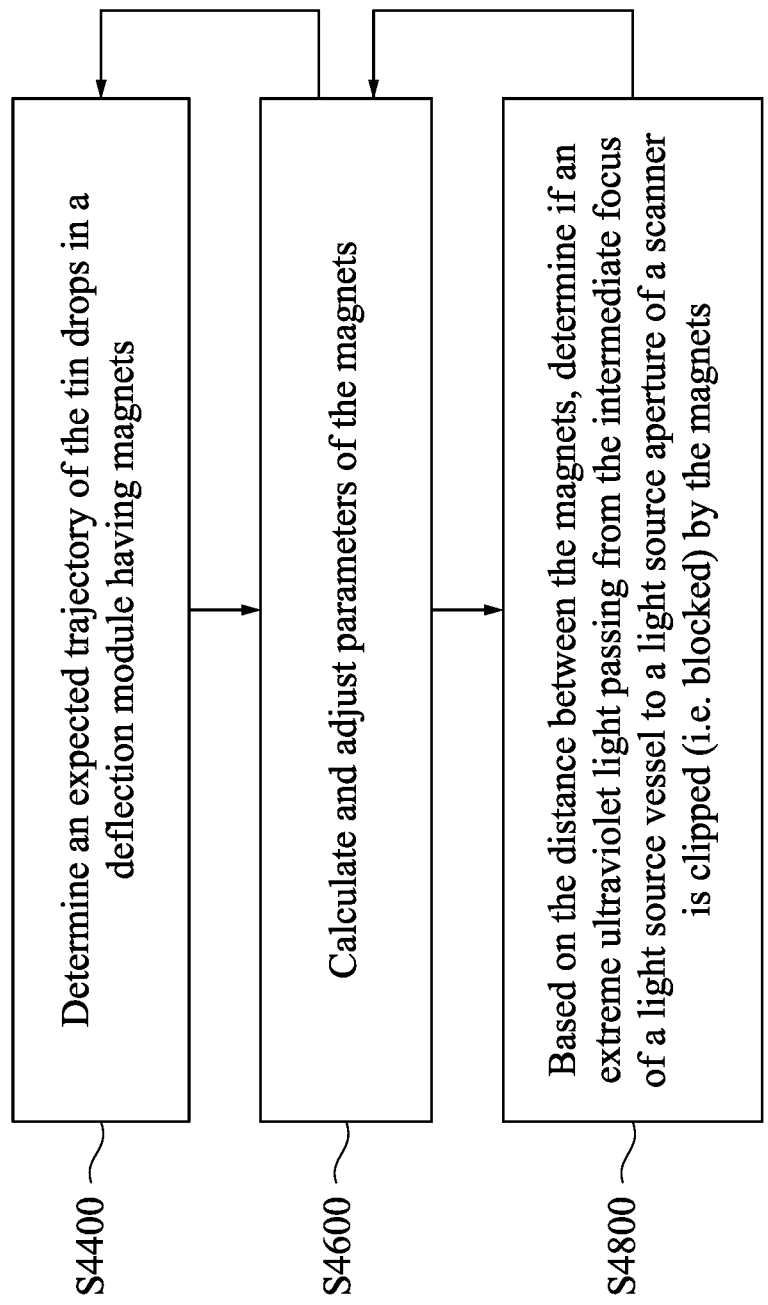
FIG. 8 shows a flowchart of a method according to some embodiments of the present disclosure.

FIG. 8 shows a flowchart of a method according to some embodiments of the present disclosure. Tin particles 600 moving from the intermediate focus 112 of the extreme ultraviolet light source vessel 100 to the light source aperture 210 of the scanner 200 have parameters including charges of the tin debris, masses of the tin debris, and velocities of the tin debris. Specifically, the tin particles 600 can have an average charge, an average mass, and an average velocity.

In operation S4400, an expected trajectory of the tin particles 600 in a deflection module 300 having magnets can be determined. The magnetic field acts on the tin particle 600 with a magnetic force of q*v*B, wherein q is the charge of the tin particle 600, v is the velocity component of the tin particle 600 perpendicular to the magnetic field lines M, and B is the magnitude of the magnetic field. The acceleration due to the magnetic force is q*v*E/m, wherein m is the mass of the tin debris. The distance by which the tin particle 600 is deflected is ½*a*t, wherein a is the acceleration described immediately above, and t is the time of the tin particle 600 between the electrode plates. Time of the tin particle 600 between the electrode plates is about a length-wise distance of the electrode plates divided by a velocity component of the tin particle 600 in the lengthwise direction of the electrode plates. Thus the expected deflection distance of the tin particle 600 depends on the strength of the electric field and the parameters of the tin particles 600 including the average charge, the average mass, and the average velocity of the tin particles 600.

In operation 54600, parameters of the magnets are calculated and adjusted. Specifically, parameters of the magnets include widths of the magnets, lengths of the magnets, magnetic strengths/intensities of the magnets, and a distance between the magnets. For example, the magnetic field controller 360 described in FIG. 3A and FIG. 3B is configured to tune currents of the electromagnetic, such that the intensity of the magnetic field can be tuned. Operation S4400 can be executed again to calculate the expected trajectory of the charged tin particle 600 according to the adjusted parameters of the magnets.

In operation 54800, based on the distance between the magnets, determine if an extreme ultraviolet light passing from the intermediate focus 150 of the extreme ultraviolet light source vessel 100 to the light source aperture 210 of the scanner 200 is clipped (i.e. blocked) by the magnets. If one or both of the magnets blocks the extreme ultraviolet light from the intermediate focus 150, operation 54600 is executed such that the magnets are moved further apart so as to not block the extreme ultraviolet light.

By applying an electric field and/or a magnetic field on a charged tin particle moving from an extreme ultraviolet light source vessel to a scanner, the tin particle is deflected from hitting and contaminating a reticle holder in the scanner.

According to some embodiments of the present disclosure, an apparatus comprises an extreme ultraviolet light source vessel having an exit, a scanner having a light source aperture and comprising a reticle holder, and a deflection module between the exit of the extreme ultraviolet light source vessel and the light source aperture of the scanner. The deflection module comprises a first electrode plate, a second electrode plate, and an electric field controller. The electric field controller is connected to the first electrode plate and the second electrode plate and configured to oppositely charge the first electrode plate and the second electrode plate.

According to some embodiments of the present disclosure, a method comprises applying an electric field between a first electrode plate and a second electrode plate of a deflection module disposed between an extreme ultraviolet light source vessel and a scanner, wherein electric field lines of the electric field extend from the first electrode plate to the second electrode plate; applying a magnetic field between a first magnet and a second magnet of the deflection module, wherein magnetic field lines of the magnetic field extend from the first magnet to the second magnet, and the magnetic field lines and the electric field lines intersect and are substantially perpendicular to each other; and introducing a charged tin particle between the first electrode plate and the second electrode plate, and between the first magnet and the second magnet.

According to some embodiments of the present disclosure, a method comprises directing an ultraviolet light at a hydrogen gas in an extreme ultraviolet light source vessel, such that hydrogen plasma is created; passing a tin particle through the hydrogen plasma, such that the tin particle becomes negatively charged; applying an electric field between a first electrode plate and a second electrode plate of a deflection module disposed between the extreme ultraviolet light source vessel and a scanner, wherein electric field lines of the electric field extend from the first electrode plate to the second electrode plate; and introducing the negatively charged tin particle between the first electrode plate and the second electrode plate in a direction from the extreme ultraviolet light source vessel to the scanner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   an extreme ultraviolet light source vessel having an exit;
   a scanner having a light source aperture and comprising a reticle holder; and
   a deflection module between the exit of the extreme ultraviolet light source vessel and the light source aperture of the scanner, wherein
   the deflection module comprises a first electrode plate, a second electrode plate, and an electric field controller connected to the first electrode plate and the second electrode plate and configured to oppositely charge the first electrode plate and the second electrode plate.

2. The apparatus of claim 1, wherein the first electrode plate and the second electrode plate are arranged between the exit of the extreme ultraviolet light source vessel and the light source aperture of the scanner.

3. The apparatus of claim 1, wherein a first face of the first electrode plate facing the second electrode plate and a second face of the second electrode plate facing the first electrode plate are substantially parallel.

4. The apparatus of claim 3, wherein the deflection module further comprises:
   a first magnet having a first magnet face; and
   a second magnet having a second magnet face; wherein the first magnet face and the second magnet face are substantially parallel to each other, and substantially perpendicular to the first face of the first electrode plate and the second face of the second electrode plate.

5. The apparatus according to claim 4, wherein the electric field controller is further configured to positively charge the first electrode plate and negatively charge the second electrode plate, the first magnet has a north pole facing the second magnet, and the second magnet has a south pole facing the first magnet.

6. The apparatus according to claim 5, wherein the first magnet, the first electrode plate, the second magnet, and the second electrode plate are arranged around a flight path of a tin particle in a clockwise sequence, when viewed in a direction from the exit of the extreme ultraviolet light source vessel to the light source aperture of the scanner.

7. The apparatus according to claim 4, wherein the electric field controller is further configured to negatively charge the first electrode plate and positively charge the second electrode plate, the first magnet has a south pole facing the second magnet, and the second magnet has a north pole facing the first magnet.

8. The apparatus according to claim 7, wherein the first magnet, the first electrode plate, the second magnet, and the second electrode plate are arranged around a flight path of a tin particle in a clockwise sequence, when viewed in a direction from the exit of the extreme ultraviolet light source vessel to the light source aperture of the scanner.

9. The apparatus according to claim 1, further comprising:
a particle trap device, configured to collect a tin particle passing between the first electrode plate and the second electrode plate.

10. The apparatus according to claim 1, further comprising:
a laser beam, configured to excite a tin particle at an excitation region in the chamber of the extreme ultraviolet light source; and
an ultraviolet light source, configured to excite hydrogen gas at a region between the excitation region and the exit.

11. A method comprising:
applying an electric field between a first electrode plate and a second electrode plate of a deflection module disposed between an extreme ultraviolet light source vessel and a scanner, wherein electric field lines of the electric field extend from the first electrode plate to the second electrode plate;
applying a magnetic field between a first magnet and a second magnet of the deflection module, wherein magnetic field lines of the magnetic field extend from the first magnet to the second magnet, and the magnetic field lines and the electric field lines intersect and are substantially perpendicular to each other; and
introducing a charged tin particle between the first electrode plate and the second electrode plate, and between the first magnet and the second magnet.

12. The method according to claim 11, wherein a velocity of the tin particle has a component perpendicular to both the electric field lines and the magnetic field lines, and when viewing in the direction of the component of the velocity of the tin particle perpendicular to the electric field lines and the magnetic field lines, a direction of the electric field lines point about 90 degrees clockwise relative to a direction of the magnetic field lines.

13. The method according to claim 11, wherein introducing the charged tin particle between the first electrode plate and the second electrode plate comprises introducing the charged tin particle in a direction from an exit of the extreme ultraviolet light source vessel to a light source aperture of the scanner.

14. The method according to claim 11, wherein the tin particle is positively charged.

15. The method according to claim 11, wherein the tin particle is negatively charged.

16. The method according to claim 11, further comprising collecting the tin particle after introducing the charged tin particle between the first electrode plate and the second electrode plate, and between the first magnet and the second magnet.

17. A method comprising:
directing an ultraviolet light at a hydrogen gas in an extreme ultraviolet light source vessel, such that hydrogen plasma is created;
passing a tin particle through the hydrogen plasma, such that the tin particle becomes negatively charged;
applying an electric field between a first electrode plate and a second electrode plate of a deflection module disposed between the extreme ultraviolet light source vessel and a scanner, wherein electric field lines of the electric field extend from the first electrode plate to the second electrode plate; and
introducing the negatively charged tin particle between the first electrode plate and the second electrode plate in a direction from the extreme ultraviolet light source vessel to the scanner.

18. The method according to claim 17, wherein directing an ultraviolet light at the hydrogen gas is such that the hydrogen gas is at a region between an excitation region in a chamber of the extreme ultraviolet light source vessel, and an exit of the extreme ultraviolet light source vessel, and the excitation region is a region where the tin particle is excited by a laser beam.

19. The method according to claim 17, further comprising:
applying a magnetic field between a first magnet and a second magnet of the deflection module, wherein magnetic field lines of the magnetic field extend from the first magnet to the second magnet, and the magnetic field lines and the electric field lines intersect and are substantially perpendicular to each other; and wherein introducing the tin particle between the first electrode plate and the second electrode plate includes introducing the tin particle between the first magnet and the second magnet.

20. The method according to claim 17, further comprising increasing a density of the hydrogen plasma prior to passing the tin particle through the hydrogen plasma.

* * * * *